(12) United States Patent
Liao et al.

(10) Patent No.: US 7,947,331 B2
(45) Date of Patent: May 24, 2011

(54) METHOD FOR MAKING THERMAL INTERFACE MATERIAL

(75) Inventors: Yun-Hsin Kevin Liao, Santa Clara, CA (US); Yuan Yao, Beijing (CN); Chang-Shen Chang, Taipei Hsien (TW); Hsien-Sheng Pei, Taipei Hsien (TW); Kai-Li Jiang, Beijing (CN); Chang-Hong Liu, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 457 days.

(21) Appl. No.: 12/110,549

(22) Filed: Apr. 28, 2008

(65) Prior Publication Data

US 2009/0269498 A1    Oct. 29, 2009

(51) Int. Cl.
*B05D 3/00* (2006.01)
(52) U.S. Cl. .......................................................... 427/294
(58) Field of Classification Search .................... 427/294
See application file for complete search history.

(56) References Cited

U.S. PATENT DOCUMENTS

| | | | | |
|---|---|---|---|---|
| 4,220,455 A | * | 9/1980 | St. Pierre et al. | 51/295 |
| 6,110,577 A | * | 8/2000 | Ishikawa et al. | 428/307.7 |
| 2005/0224220 A1 | * | 10/2005 | Li et al. | 165/185 |
| 2006/0231946 A1 | * | 10/2006 | Pan et al. | 257/712 |

* cited by examiner

*Primary Examiner* — Timothy H Meeks
*Assistant Examiner* — Nathan H Empie
(74) *Attorney, Agent, or Firm* — Andrew C. Cheng

(57) ABSTRACT

A method for making a thermal interface material includes the steps of: (a) providing an array of carbon nanotubes formed on a substrate, the carbon nanotubes having interfaces defined therebetween; (b) providing a transferring device and disposing at least one low melting point metallic material above the array of carbon nanotubes, using the transferring device; and (c) heating the low melting point metallic material and the array of carbon nanotube to a certain temperature to make the at least one low melting point metallic material melt, then flow into the interspaces between the carbon nanotubes, and combine (e.g., mechanically) with the array of carbon nanotubes to acquire a carbon-nanotube-based thermal interface material.

12 Claims, 2 Drawing Sheets

METHOD FOR MAKING THERMAL INTERFACE MATERIAL

BACKGROUND

1. Field of the Invention

The present invention relates to methods for making thermal interface material, and particularly to a method for making carbon-nanotube-based thermal interface material.

2. Discussion of Related Art

Electronic components such as semiconductor chips are becoming progressively smaller, while at the same time heat dissipation requirements thereof are increasing. Commonly, thermal interface material is utilized between the electronic component and an integrated heat spreader/sink, in order to efficiently dissipate heat generated by the electronic component. However, the performance of the thermal interface material is generally restricted by a heat conduction coefficient thereof. The heat conduction coefficient of typical thermal interface units is now considered to be too low for many contemporary applications.

Conventional thermal interface materials are metallic materials. However, the metallic materials disadvantageously tend to have a much higher coefficient of thermal expansion than do semiconductor devices. Mechanical stresses are induced during temperature cycling and will tend to overstress the electronic components, thereby leading to potential failures when metallic materials are used as a thermal interface material.

A recently developed thermal interface material is a composite material obtained by combining carbon nanotube arrays with a polymer or a low melting point metallic material. The carbon nanotubes are orderly distributed and provide a heat conduction path therein. Additionally, the carbon nanotubes can protrude from the polymer or low melting point metallic material and contact the electronic components or the integrated heat spreaders. However, the heat conduction coefficient of the polymer is relatively low. As such, the performance of the thermal interface material is restricted by the polymer used. Since metals generally have a higher heat conduction coefficient than polymers, the thermal interface materials using carbon nanotube arrays combined with low melting point metallic materials have attracted lots of attention, due to the potential for improved heat conduction coefficients.

Methods for making the thermal interface material using low melting point metallic materials combined with carbon nanotube arrays generally have employed chemical vapor deposition or physical vapor deposition. In these methods, the low melting point metallic materials are heated to a gaseous state and deposited in the interspaces between the carbon nanotubes of the carbon nanotube array. However, although some of these metallic materials have a low melting point, they also have a very high boiling point, e.g., the melting point of indium is 157° C. and the boiling point thereof is 2000° C. Thus, the above-described methods consume lots of energy, and the costs thereof are quite high.

What is needed, therefore, is a method for making a carbon-nanotube-based thermal interface material, wherein the low melting point metals just need to be heated to a liquid state.

SUMMARY

In one embodiment, a method for making a thermal interface material includes the steps of: (a) providing an array of carbon nanotubes formed on a substrate, the carbon nanotubes having interfaces defined therebetween; (b) providing a transferring device and disposing at least one low melting point metallic material above the array of carbon nanotubes, using the transferring device; and (c) heating the low melting point metallic material and the array of carbon nanotube to a certain temperature to make the at least one low melting point metallic material melt, then flow into the interspaces between the carbon nanotubes, and combine (e.g., mechanically) with the array of carbon nanotubes to acquire/yield a carbon-nanotube-based thermal interface material.

Other advantages and novel features of the present method for making the thermal interface material will become more apparent from the following detailed description of preferred embodiments when taken in conjunction with the accompanying drawings.

BRIEF DESCRIPTION OF THE DRAWINGS

Many aspects of the present invention of the method for making the thermal interface material can be better understood with reference to the following drawings.

Figure 1:
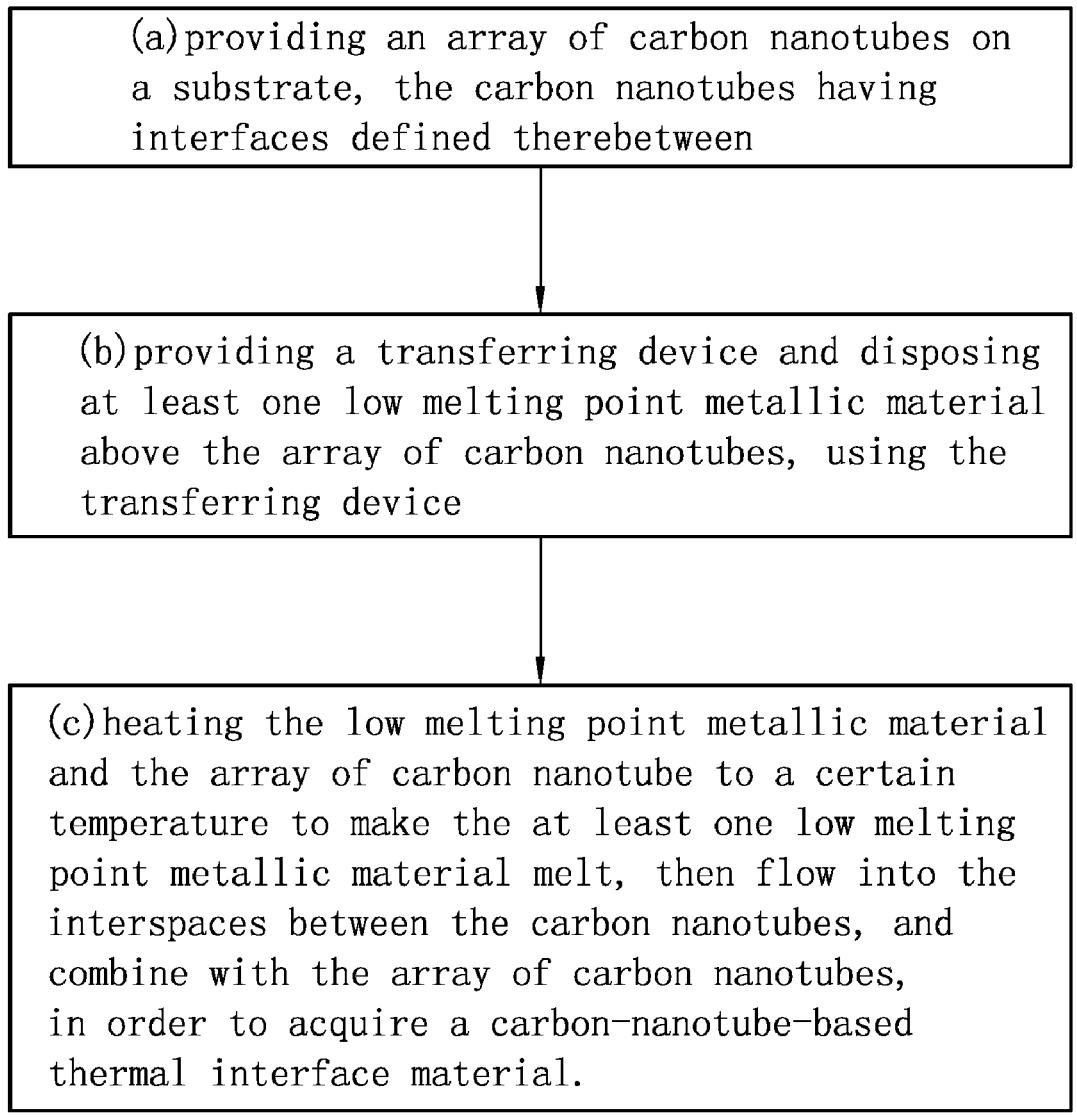
FIG. 1 is flow chart of a method for making a thermal interface material, according to the present embodiment.

Corresponding reference characters indicate corresponding parts throughout the several views. The exemplifications set out herein illustrate at least one preferred embodiment of the present method for making the thermal interface material, in at least one form, and such exemplifications are not to be construed as limiting the scope of the invention in any manner.

DETAILED DESCRIPTION OF PREFERRED EMBODIMENTS

Reference will now be made to the drawings to describe, in detail, embodiments of the present method for making the thermal interface material.

Referring to FIG. 1, a method for making a thermal interface material includes the steps of: (a) providing an array of carbon nanotubes formed on a substrate, the carbon nanotubes having interfaces defined therebetween; (b) providing a transferring device and disposing at least one low melting point metallic material above the array of carbon nanotubes, using the transferring device; and (c) heating the at least one low melting point metallic material and the array of carbon nanotube to a certain temperature to make the at least one low melting point metallic material melt, then flow into the interspaces between carbon nanotubes of the array of carbon nanotubes, and combine (e.g., mechanically) with the array of carbon nanotubes to acquire a carbon-nanotube-based thermal interface material.

In step (a), the array of carbon nanotubes is, beneficially, a super-aligned array of carbon nanotubes. The super-aligned array of carbon nanotubes can be formed by the substeps of: (a1) providing a substantially flat and smooth substrate; (a2) forming a catalyst layer on the substrate; (a3) annealing the substrate with the catalyst at a temperature in the approximate range from 700° C. to 900° C. in air for about 30-90 minutes; (a4) heating the substrate with the catalyst at a temperature in the approximate range from 500° C. to 740° C. in a furnace with a protective gas therein; and (a5) supplying a carbon source gas into the furnace for about 5-30 minutes and growing a super-aligned array of the carbon nanotubes from the substrate.

In step (a1), the substrate can, beneficially, be a P-type silicon wafer, an N-type silicon wafer, or a silicon wafer with a film of silicon dioxide thereon. Quite usefully, a 4-inch P-type silicon wafer is used as the substrate. In step (a2), the catalyst can, advantageously, be made of iron (Fe), cobalt (Co), nickel (Ni), or any alloy thereof.

In step (a4), the protective gas can, beneficially, be made up of at least one of nitrogen ($N_2$), ammonia ($NH_3$), and a noble gas. In step (a5), the carbon source gas can, advantageously, be a hydrocarbon gas, such as ethylene ($C_2H_4$), methane ($CH_4$), acetylene ($C_2H_2$), ethane ($C_2H_6$), or any combination thereof.

The super-aligned array of carbon nanotubes can, opportunely, be in a height of about 1 micron to about 500 microns and includes a plurality of carbon nanotubes parallel to each other and substantially perpendicular to the substrate. The super-aligned array of carbon nanotubes formed under the above conditions is essentially free of impurities, such as carbonaceous or residual catalyst particles. The carbon nanotubes in the super-aligned array are packed together closely by van der Waals attractive force. The array of carbon nanotubes formed on the substrate has a first surface and a second surface. The second surface of the array of carbon nanotubes contacts the substrate.

It is to be understood that the array of carbon nanotubes can, alternatively, be formed by other methods known in the art.

Figure 2:
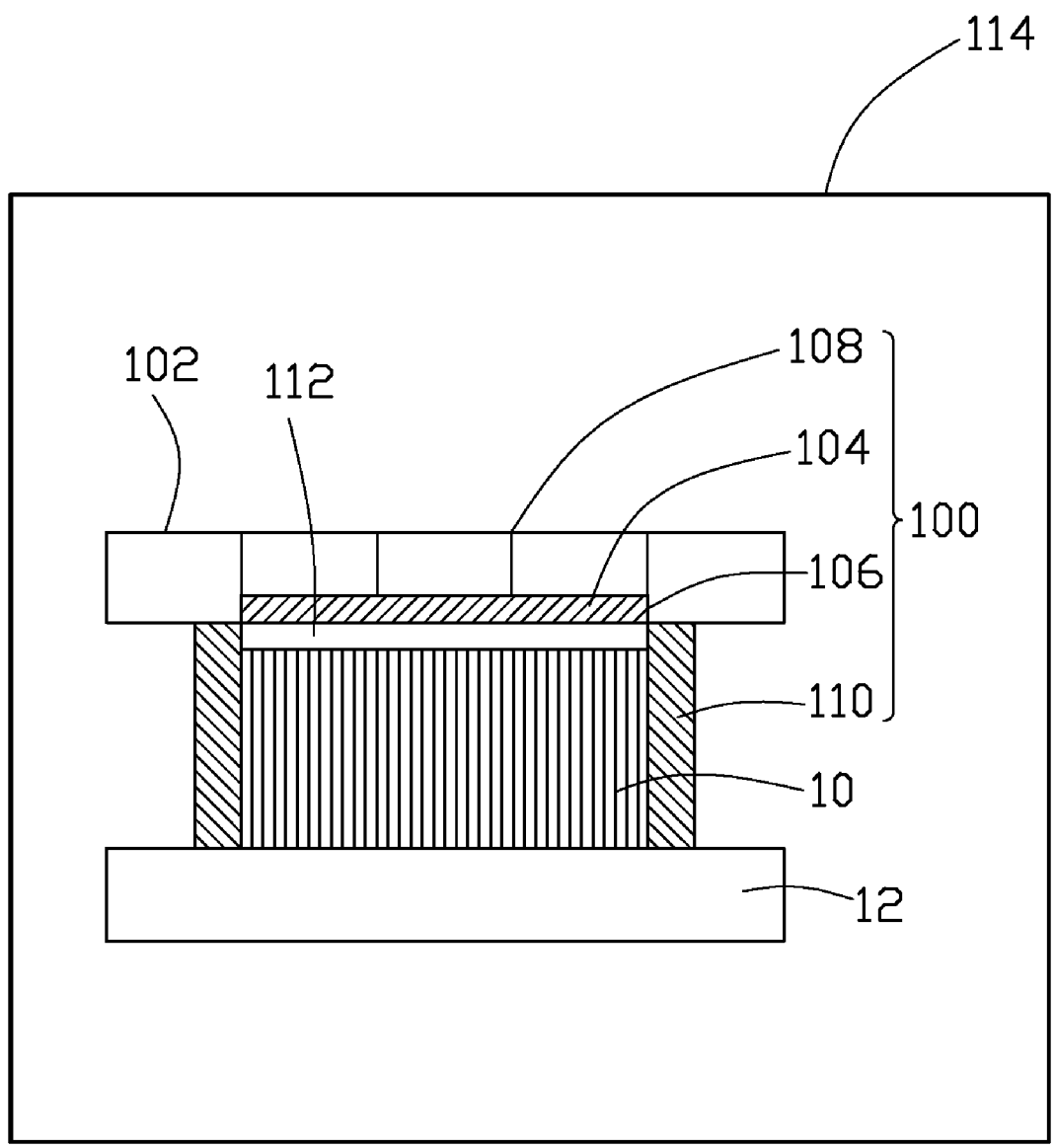
FIG. 2 is a schematic view of a device for making the thermal interface material, according to the present embodiment.

Referring to FIG. 2, in step (b), the transferring device 100 includes a transferring plate 102 and a sealed ring 110. The transferring plate 102 has a cavity 106 therein that is filled with at least one low melting point metallic material 104. Such a cavity 106 is arranged facing the array of carbon nanotubes. The transferring plate 102 has a plurality of air holes 108 to permit communication of the cavity 106, filled with the at least one low melting point metallic material 104, with an exterior space (e.g., ambient). The sealed ring 110 is disposed between the transferring plate 102 and substrate 12, thereby forming a space therebetween and the array of carbon nanotubes is disposed in the space. The sealed ring 110 supports the transferring plate 102 above the array of carbon nanotubes 10 and maintains a constant gap 112 to allow the at least one low melting point metallic material 104 to flow (e.g., due to gravity and/or surface wetting) into the array of carbon nanotubes 10.

The melting point of the at least one low melting point metallic material 104 is, advantageously, less than about 265° C. The melting point of the at least one low melting point metallic material 104 is, beneficially, low, thereby allowing the low melting point metallic material 104 to readily change to a liquid state and thus better promote heat dissipation when the temperature of the electronic component is high. The at least one low melting point metallic material 104 may, for example, include tin, copper, indium, lead, antimony, gold, silver, bismuth, or alloys thereof or mixture thereof, and so on. The at least one low melting point metallic material 104 can be a single-layer structure or a multi-layer structure. The single-layer structure of the at least one low melting point metallic material 104 can, e.g., be a tin-lead alloy, indium-tin alloy, tin-silver-copper alloy, gold-silicon alloy, gold-germanium alloy, and so on. The multi-layer structure of the at least one low melting point metallic material 104 can, for example, be a three-layer structure, e.g., one layer of indium, a second layer of a tin alloy, and the other layer of gold-silicon alloy; a two-layer structure, e.g., one layer of indium and the other layer of a bismuth alloy; or any other appropriate multi-layer structure.

In step(c), the temperature must be higher than the melting point of the at least one low melting point metallic material 104. The melted at least one low melting point metallic material 104 flows out from the cavity 106 into the interspaces between the carbon nanotubes of the array of carbon nanotubes 10. After that, a negative pressure is applied to the furnace 114 to extract air from between the carbon nanotubes and the melted low melting point metallic material 104 to make the array of carbon nanotubes 10 and the low melting point metallic material 104 combine sufficiently (i.e., to promote a sufficiently uniform distribution of the low melting point metallic material 104 relative to the array of carbon nanotubes 10). The extracted air is, beneficially, forced out through the air holes 108 of the transferring plate 102. After combining the array of carbon nanotubes 10 with the low melting point metallic material 104, a thermal interface material is formed on the substrate 12, and after the furnace 114 has cooled down, the thermal interface material can be removed from the substrate to be a stand-alone thermal interface material. Alternatively, the thermal interface material can be retained, as a unit, with the substrate 12 to define a heat spreader and/or a heat sink.

The combination of the low melting point metallic material 104 and the array of carbon nanotubes 10 provides a thermal interface material with a high heat conduction coefficient. Additionally, the thermal expansion coefficient of the carbon nanotube/metal composite of the resulting thermal interface material more closely matches that of a typical semiconductor material than the thermal expansion coefficient of a typical metal would.

In use, the thermal interface material of the present embodiment can be disposed between an electronic component and a heat spreader/heat sink. When a temperature is elevated above the melting point of the low melting point metallic material 104, the low melting point metallic material 104 changes to a liquid, with the sealed ring 110 serving to generally retain the molten metal. The liquefied low melting point metallic material 104 is capable of filling the gaps between the electronic component and the heat spreader and, as such, reduces the thermal contact resistance therebetween. Further, due to a high thermal conductivity of the metallic material, the thermal interface material has a higher thermal conductivity than a polymer-carbon-nanotube composite. Additionally, during temperature cycling, mechanical stress of the metallic material can be reduced by the carbon nanotubes dispersed therein. What is more, the method for making the thermal interface material of the present embodiment is low cost since the method of making such only requires heating the low-melting metallic materials to a liquid state and, possibly, the application of a negative pressure (i.e., some level of vacuum) to promote distribution of the molten metallic materials within the array of carbon nanotubes.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for making a thermal interface material, the method comprising:
   (a) providing an array of carbon nanotubes on a substrate, the carbon nanotubes having interfaces defined therebetween;
   (b) providing a transferring device and disposing at least one low melting point metallic material above the array of carbon nanotubes via the transferring device, wherein the melting point of the at least one low melting point metallic material is less than about 265° C., the transferring device comprises a transferring plate defining a cavity facing the array of carbon nanotubes, the at least one low melting point metallic material is located in the cavity;

wherein in step (b), the transferring device further comprises a sealed ring, wherein the sealed ring is disposed between the transferring plate and the substrate, thereby defining a space therebetween, the array of carbon nanotubes being disposed in the space; and wherein the sealed ring supports the transferring plate above the array of carbon nanotubes and maintains a constant gap to allow the at least one low melting point metallic material to flow into the array of carbon nanotubes; and (c) heating the low melting point metallic material and the array of carbon nanotube to a certain temperature to make the at least one low melting point metallic material melt, then flow into the interspaces between the carbon nanotubes, and combine with the array of carbon nanotubes, in order to acquire a carbon-nanotube-based thermal interface material; and wherein the at least one low melting point metallic material located in the cavity before step (c) is solid.

2. The method as claimed in claim 1, wherein in step (a), a height of the array of carbon nanotubes is in an approximate range from 1 micron to 500 microns.

3. The method as claimed in claim 1, wherein the transferring plate is spaced from and located above the array of carbon nanotubes.

4. The method as claimed in claim 1, wherein the at least one low melting point metallic material is a single-layer structure or a multi-layer structure.

5. The method as claimed in claim 1, wherein the transferring plate has a plurality of air holes to permit communication of the cavity with an exterior space.

6. The method as claimed in claim 5, wherein air in the array of carbon nanotubes is forced out through the air holes.

7. The method as claimed in claim 1, wherein the material of the at least one low melting point metallic material is selected from the group consisting of tin, copper, indium, lead, antimony, gold, silver, bismuth, and alloys thereof.

8. The method as claimed in claim 1, further comprising a step of applying a negative pressure to extract out air from between the carbon nanotubes of the array of carbon nanotubes and the melted low melting point metallic material, the negative pressure promoting the flow of the melted low melting point metallic material into the interspaces between the carbon nanotubes, thereby improving a distribution of the low melting point metallic material within the array of carbon nanotubes.

9. The method as claimed in claim 1, further comprising a step of removing the substrate from the thermal interface material to form a stand-alone thermal interface material, after cooling down the thermal interface material.

10. The method as claimed in claim 1, wherein the array of carbon nanotubes in the step (a) is fabricated by:
(a1) providing the substrate, wherein the substrate is substantially flat and smooth;
(a2) forming a catalyst layer on the substrate;
(a3) annealing the substrate with the catalyst at a temperature in an approximate range from about 700° C. to about 900° C. in air for about 30 minutes to about 90 minutes;
(a4) heating the substrate with the catalyst at a temperature in an approximate range from about 500° C. to about 740° C. in a furnace with a protective gas therein; and
(a5) supplying a carbon source gas into the furnace for about 5 minutes to about 30 minutes and growing a super-aligned array of the carbon nanotubes from the substrate.

11. The method as claimed in claim 10, wherein the array of carbon nanotubes comprises a plurality of carbon nanotubes parallel to each other and substantially perpendicular to the substrate.

12. The method as claimed in claim 11, wherein the carbon nanotubes in the super-aligned array are packed together closely by van der Waals attractive force.

* * * * *